United States Patent
Lee

(10) Patent No.: US 7,450,463 B2
(45) Date of Patent: Nov. 11, 2008

(54) ADDRESS BUFFER AND METHOD FOR BUFFERING ADDRESS IN SEMICONDUCTOR MEMORY APPARATUS

(75) Inventor: Sang-Kwon Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 3 days.

(21) Appl. No.: 11/641,032

(22) Filed: Dec. 19, 2006

(65) Prior Publication Data
US 2007/0211555 A1 Sep. 13, 2007

(30) Foreign Application Priority Data
Mar. 9, 2006 (KR) ............ 10-2006-0022335

(51) Int. Cl.
*G11C 11/00* (2006.01)
(52) U.S. Cl. ................ 365/230.08; 365/233.5
(58) Field of Classification Search ........... 365/230.08, 365/233, 233.5
See application file for complete search history.

(56) References Cited

U.S. PATENT DOCUMENTS

| | | | |
|---|---|---|---|
| 5,107,465 A | | 4/1992 | Fung et al. |
| 5,592,685 A | * | 1/1997 | Pawlowski ............ 710/62 |
| 6,058,451 A | * | 5/2000 | Bermingham et al. ....... 711/106 |
| 6,075,830 A | * | 6/2000 | Piirainen ............ 375/354 |
| 7,002,871 B2 | | 2/2006 | Takeuchi et al. |
| 2003/0097535 A1 | * | 5/2003 | Hsu et al. ............ 711/169 |
| 2005/0207254 A1 | * | 9/2005 | Lovett ............ 365/222 |
| 2005/0226090 A1 | | 10/2005 | Lee |
| 2005/0232065 A1 | * | 10/2005 | Jeong ............ 365/233 |
| 2006/0291323 A1 | * | 12/2006 | Freebern ............ 365/233 |

FOREIGN PATENT DOCUMENTS

| | | |
|---|---|---|
| JP | 11238380 | 8/1999 |
| JP | 2005302252 | 10/2005 |
| JP | 2005342881 | 12/2005 |
| KR | 1019960032662 | 9/1996 |
| KR | 1020050100262 A | 10/2005 |

* cited by examiner

*Primary Examiner*—Michael T Tran
(74) *Attorney, Agent, or Firm*—Venable LLP; Jeffri A. Kaminski

(57) ABSTRACT

An address buffer in a semiconductor memory apparatus includes: an address input unit that generates a first latch input address from a buffering enable signal and an input address. A clock synchronizing unit generates a second latch input address from the first latch input address and a clock. A synchronous address latch unit generates a synchronous output address from a command pulse signal and the second latch input address. A synchronous mode detecting unit determines whether a mode is a synchronous mode or not from a valid address signal and the clock to generate a synchronous mode signal. An asynchronous address latch unit generates an asynchronous output address from the synchronous mode signal, an address strobing signal, and the second latch input address.

64 Claims, 9 Drawing Sheets

ADDRESS BUFFER AND METHOD FOR
BUFFERING ADDRESS IN
SEMICONDUCTOR MEMORY APPARATUS

CROSS-REFERENCE TO RELATED PATENT
APPLICATION

This application claims the benefit of Korean Patent Application No. 10-2006-0022335, filed on Mar. 9, 2006, in the Korean Intellectual Property Office, the disclosure of which is incorporated herein in its entirety by reference.

BACKGROUND OF THE INVENTION

1. Technical Field

The present invention relates to an address buffer and a method of buffering an address for a semiconductor memory apparatus. More particularly, the present invention relates to an address buffer and a method of buffering an address for a semiconductor memory apparatus, in which both a synchronous address buffering operation and an asynchronous address buffering operation can be performed.

2. Related Art

In general, a number of memory cells are included in a semiconductor memory apparatus and a data input and output operation is performed on the respective memory cells by using addresses. The address is input from the outside of the semiconductor memory apparatus. The semiconductor memory apparatus includes an address buffer, and an external address is converted into an internal address for use in the semiconductor memory apparatus. There are semiconductor memory apparatuses that use clocks, and that do not use clocks. Accordingly, a semiconductor memory apparatus that uses a clock includes a synchronous address buffer, and a semiconductor memory apparatus that does not use a clock includes an asynchronous address buffer.

Hereinafter, an address buffer according to the related art will be described with reference to the accompanying drawings.

FIG. 1 is a block diagram illustrating the structure of an asynchronous address buffer in a semiconductor memory apparatus according to the related art.

The asynchronous address buffer includes an address input unit 2 that receives a buffering enable signal ben and an input address iad, and generates a latch input address lia; and an address latch unit 4 that receives an address strobing signal ast and the latch input address lia, and generates an asynchronous output address aoa.

At this time, the buffering enable signal ben is a low level enable signal, and the address strobing signal ast is a high level enable signal. The buffering enable signal ben can be generated by using a falling edge of a /CS (Chip Select) signal. In addition, the address strobing signal ast can be generated by using a falling edge of an /ADV signal (Valid Address Command) which is a command signal instructing an input operation of an address or a rising edge of a clock inputted in a state where the /ADV signal is enabled. However, the methods of generating the buffering enable signal ben and the address strobing signal ast are not limited thereto.

If the buffering enable signal ben is disabled, that is, the buffering enable signal ben has a high level voltage, the latch input address lia, which is the output of the address input unit 2 in response to the input of the input address iad, has a high level voltage regardless of the voltage level of the input address iad. At this time, the latch input address lia does not function as an address.

However, if the buffering enable signal ben is enabled, it has a low level voltage, the input address iad is driven in the address input unit 2 and is then outputted as the latch input address lia. At this time, the latch input address lia has the same phase as the input address iad.

Then, if the address strobing signal ast is enabled, the latch input address lia is input to the address latch unit 4. The address latch unit 4 drives the latch input address lia input at a rising edge time of the address strobing signal ast to generate the asynchronous output address aoa, and stores the generated asynchronous output address aoa. At this time, the asynchronous output address aoa has the same voltage level as the latch input address lia. However, the latch input address lia input in a state where the address strobing signal ast is disabled does not affect the asynchronous output address aoa, and at this time, the asynchronous output address aoa is an invalid address.

FIG. 2 is a block diagram illustrating a structure of the synchronous address buffer in a semiconductor memory apparatus according to the related art.

As shown in FIG. 2, the synchronous address buffer includes an address input unit 6 that receives the buffering enable signal ben and the input address iad and generates a first latch input address lia1; a clock synchronizing unit 8 that synchronizes the first latch input address lia1 with a clock clk and generates a second latch input address lia2; and an address latch unit 10 that receives a command pulse signal cmp and the second latch input address lia2 and generates the synchronous output address soa.

In this case, the command pulse signal cmp can be generated by using a rising edge of the clock input in a state where the /ADV signal is enabled. However, the method of generating the command pulse signal cmp is not limited thereto.

As in the asynchronous address buffer, if the buffering enable signal ben is disabled, the first latch input address lia1, which is the output of the address input unit 6 in response to the input of the input address iad, has a high level voltage regardless of the voltage level of the input address iad. At this time, the latch input address iad does not function as an address.

However, if the buffering enable signal ben is enabled, the input address iad is driven in the address input unit 6 and is then output as the first latch input address lia1. At this time, the first latch input address lia1 has the same phase as the input address iad.

Then, the clock synchronizing unit 8 receives the first latch input address lia1, drives the first latch input address lia1 at a rising edge time of the clock clk so as to generate the second latch input address lia2, and stores the generated second latch input address lia2. At this time, the second latch input address lia2 has the same phase as the first latch input address lia1. The voltage level of the second latch input address lia2 is maintained until the next rising edge time of the clock clk. The clock synchronizing unit 8 performs the above-described operation repeatedly for each rising edge time of the clock clk.

The address latch unit 10 receives the second latch input address lia2, drives the second latch input address lia2 at a rising edge time of the command pulse signal cmp so as to generate the synchronous output address soa, and stores the generated synchronous output address soa. At this time, the synchronous output address soa has the same phase as the second latch input address lia2. The voltage level of the synchronous output address soa is maintained until the next rising edge time of the command pulse signal cmp. The address latch unit 10 performs the above-described operation repeatedly for each rising edge time of the command pulse signal cmp.

FIG. 3 is a timing chart illustrating the operation of the asynchronous address buffer shown in FIG. 1. In order to describe the operation of the asynchronous address buffer according to whether a clock exists or not, an operation interval is divided into an interval where a clock is not input and an interval where a clock is input.

FIG. 3 shows the clock clk, the /CS signal, the /ADV signal, the input address iad, the address strobing signal ast, the buffering enable signal ben, the latch input address lia, and the asynchronous output address aoa. In this case, the /CS signal, the /ADV signal, and the buffering enable signal ben are low level enable signals. From FIG. 3, it can be understood that the buffering enable signal ben is enabled by a failing edge of the /CS signal. Further, it can be understood that the input address iad has a valid value and the address strobing signal ast is generated based on the /ADV signal. If the buffering enable signal ben is enabled, the latch input address lia has the same phase as the input address iad. In addition, the asynchronous output address aoa is generated from the latch input address lia at a rising edge time of the address strobing signal ast.

At this time, if the clock clk starts to be input, the interval of when the input address iad has a valid value is decreased, due to the following reason. Since a set-up time and a hold time of the input address iad for the clock clk are set in advance, an interval when the input address iad is valid cannot exceed a falling edge of the clock clk. During an interval of when the clock clk is not inputted, the input address iad maintains a valid value for a predetermined time even after the /ADV signal is disabled. However, if the clock clk starts to be inputted, the interval when the input address lad is valid is reduced. Therefore, an interval when the latch input address lia is valid is also reduced, and the address strobing signal ast latches an invalid value of the latch input address lia. Therefore, the asynchronous output address aoa has an invalid value.

FIG. 4 is a timing chart illustrating the operation of the synchronous address buffer shown in FIG. 2. As in FIG. 3, in order to describe the operation of the synchronous address buffer according to whether the clock exists or not, an operation interval is divided into an interval where the clock is not input, and an interval where the clock is input.

FIG. 4 shows the clock clk, the /CS signal, the /ADV signal, the input address iad, the first latch input address lia1, the second latch input address lia2, the command pulse signal cmp, and the synchronous output address soa. As in FIG. 3, the /CS signal and the /ADV signal are low level enable signals. From FIG. 3, it can be understood that the input address iad has a valid value based on the /ADV signal. In addition, it can be understood that the first latch input address lia1 is generated by the input address iad. The second latch input address lia2 is generated from the first latch input address lia1 at a rising edge time of the clock clk. If the first latch input address lia1 has a valid value at a rising edge time of the clock clk, the second latch input address lia2 also has a valid value with the same phase as the first latch input address lia1, and if the first latch input address lia1 has an invalid value, the second latch input address lia2 also has an invalid value. Similarly, the synchronous output address soa is also generated from the second latch input address lia2 at a rising edge time of the command pulse signal cmp.

At this time, it can be understood that the synchronous output address soa has an invalid value during an interval when the clock clk is not input. This is because the clock clk does not exist, and thus the second latch input address lia2 and the command pulse signal cmp are not generated.

As such, in the semiconductor memory apparatus according to the related art, if the clock is input, the synchronous address buffer operates normally, while the asynchronous address buffer cannot generate the normal output address. Further, if the clock is not inputted, the asynchronous address buffer operates normally, while the synchronous address buffer cannot generate the normal output address. According to the related art, there are technical limits in implementing a semiconductor memory apparatus, such as a Pseudo SRAM, where the clock is selectively input.

SUMMARY OF THE INVENTION

Embodiments of the present invention provide an address buffer and a method of buffering an address for a semiconductor memory apparatus, in which an address buffering operation is performed regardless of whether the clock is input or not.

An embodiment of the present invention provides an address buffer in a semiconductor memory apparatus including: an address input unit that generates a first latch input address from a buffering enable signal and an input address; a clock synchronizing unit that generates a second latch input address from the first latch input address and a clock; a synchronous address latch unit that generates a synchronous output address from a command pulse signal and the second latch input address; a synchronous mode detecting unit that determines whether a mode is a synchronous mode or not from a valid address signal and the clock to generate a synchronous mode signal; and an asynchronous address latch unit that generates an asynchronous output address from the synchronous mode signal, an address strobing signal, and the second latch input address.

Another embodiment of the present invention provides an address buffer in a semiconductor memory apparatus including: a clock synchronizing unit that drives, when the voltage of a clock is at a low level, a first latch input address to generate a second latch input address, and latches, when the voltage of the clock is at a high level, the second latch input address; a synchronous address latch unit that performs, when a synchronous mode is detected, driving and latching the second latch input address to generate a synchronous output address; and an asynchronous address latch unit that performs, when an asynchronous mode is detected, driving and latching the second latch input address according to the control of an address strobing signal to generate an asynchronous output address.

Still another embodiment of the present invention provides a method for buffering an address in a semiconductor memory apparatus including: generating a first latch input address from a buffering enable signal and an input address; generating a second latch input address, from the first latch input address and a clock; determining whether a mode is a synchronous mode from a valid address signal and the clock thereby generating a synchronous mode signal; generating a synchronous output address from a command pulse signal and the second latch input address; and generating an asynchronous output address from the synchronous mode signal, an address strobing signal, and the second latch input address.

Yet another embodiment of the present invention provides a method for buffering an address in a semiconductor memory apparatus including: driving a first latch input address to generate a second latch input address when a voltage of a clock is at a low level, and latching the second latch input address when a voltage of a clock is at a high level;

driving and latching the second latch input address to generate a synchronous output address when a synchronous mode is detected; and driving and latching the second latch input address to generate an asynchronous output address by controlling of an address strobing signal when an asynchronous mode is detected.

DESCRIPTION OF EXEMPLARY EMBODIMENTS

Embodiments of the present invention will now be described in detail with reference to the accompanying drawings.

Figure 1:
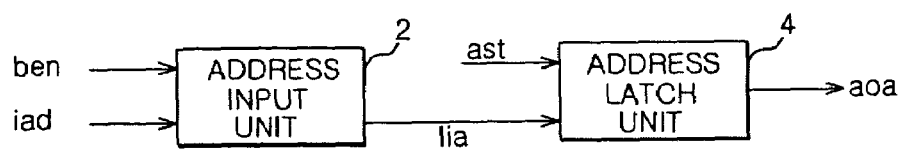
FIG. 1 is a block diagram illustrating the structure of an asynchronous address buffer in a semiconductor memory apparatus according to the related art.
Figure 2:
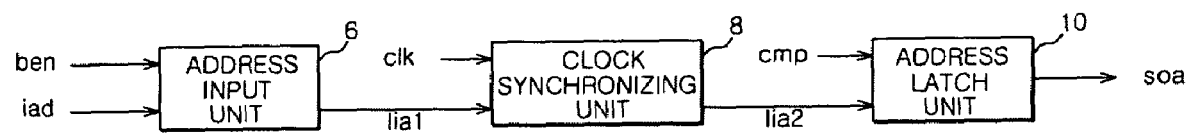
FIG. 2 is a block diagram illustrating the structure of a synchronous address buffer in a semiconductor memory apparatus according to the related art.
Figure 3:
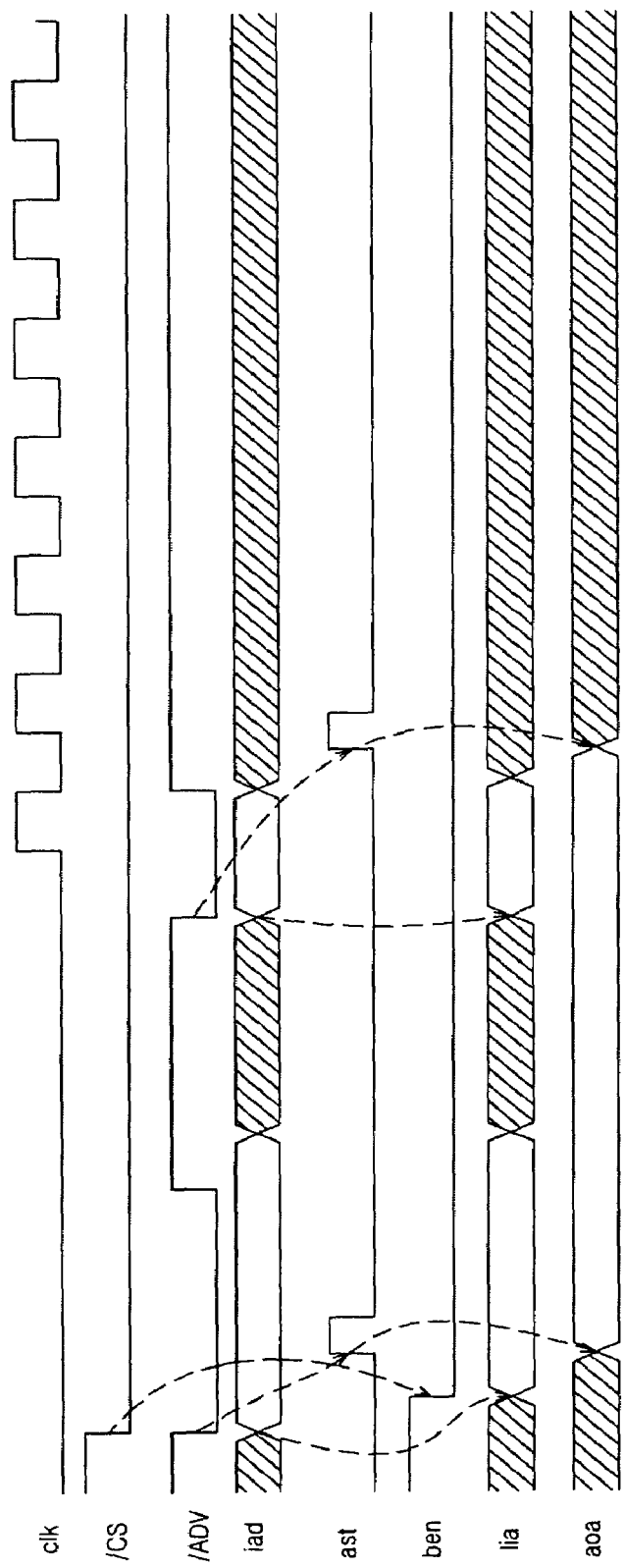
FIG. 3 is a timing chart illustrating the operation of the asynchronous address buffer shown in FIG. 1.
Figure 4:
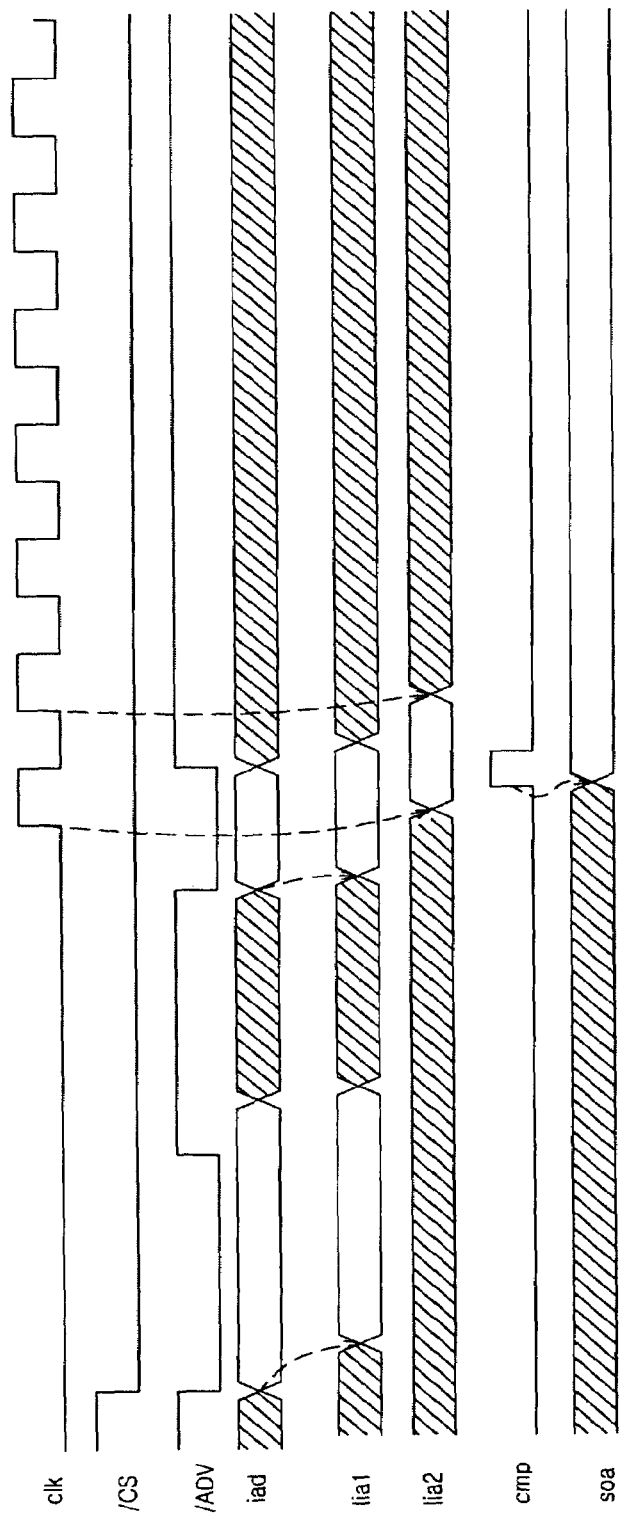
FIG. 4 is a timing chart illustrating the operation of the synchronous address buffer shown in FIG. 2.
Figure 5:
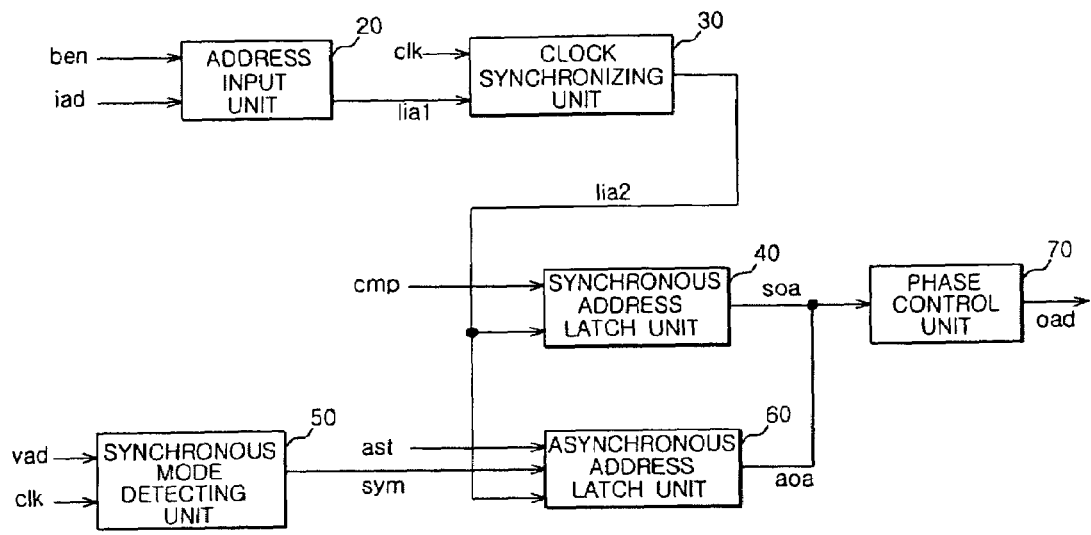
FIG. 5 is a block diagram illustrating the structure of an address buffer in a semiconductor memory apparatus according to an embodiment of the present invention.

FIG. 5 is a block diagram illustrating the structure of an address buffer in a semiconductor memory apparatus according to an embodiment of the present invention.

As shown in FIG. 5, an address buffer in a semiconductor memory apparatus according to an embodiment of the present invention includes an address input unit 20; a clock synchronizing unit 30; a synchronous address latch unit 40; a synchronous mode detecting unit 50; an asynchronous address latch unit 60; and a phase control unit 70.

The address input unit 20 receives a buffering enable signal ben and an input address iad and generates a first latch input address lia1. After the buffering enable signal ben is enabled, if it is input to the address input unit 20, the input address iad is driven in the address input unit 20, and is then output as the first latch input address lia1. At this time, the first latch input address lia1 has the same phase as the input address iad.

The clock synchronizing unit 30 receives the first latch input address lia1 and a clock clk and generates a second latch input address lia2. That is, if the clock clk is at a low level, the clock synchronizing unit 30 drives the first latch input address lia1 and outputs and latches it as the second latch input address lia2. Meanwhile, if the clock clk is at a high level, the clock synchronizing unit 30 intercepts the input of the first latch input address lia1, and maintains the state of the second latch input address lia2 that is already generated.

The synchronous address latch unit 40 that receives a command pulse signal cmp and the second latch input address lia2 and generates a synchronous output address soa. That is, the synchronous address latch unit 40 receives the second latch input address lia2, drives it at a rising edge time of the command pulse signal cmp to generate the synchronous output address soa, and stores the generated synchronous output address soa. At this time, the synchronous output address soa has the same phase as the second latch input address lia2. Therefore, the voltage level of the synchronous output address soa is maintained until a next rising edge time of the command pulse signal cmp. The synchronous address latch unit 40 performs the above-described operation repeatedly for each rising edge time of the command pulse signal cmp. After all, if the clock clk is not input, the command pulse signal cmp is not generated. Therefore, it can be understood that the synchronous output address soa is generated when the clock clk is input.

The synchronous mode detecting unit 50 receives a valid address signal vad and the clock clk, determines whether a current mode is a synchronous mode or not on the basis of the valid address signal vad and the clock clk, and generates a synchronous mode signal sym. That is, in a state where the valid address signal vad is enabled, if the clock clk is input, the synchronous mode detecting unit 50 generates the synchronous mode signal sym.

The asynchronous address latch unit 60 receives the synchronous mode signal sym, an address strobing signal ast, and the second latch input address lia2, and generates an asynchronous output address aoa. That is, when the synchronous mode signal sym is enabled, the asynchronous address latch unit 60 intercepts the input of the second latch input address lia2. Meanwhile, in a state where the synchronous mode signal sym is disabled, if the address strobing signal ast is enabled, the synchronous address latch unit 60 receives the second latch input address lia2. Then, the asynchronous address latch unit 60 drives the second latch input address lia2 input at the rising edge time of the address strobing signal ast so as to generate the asynchronous output address aoa, and stores the generated asynchronous output address aoa. At this time, the asynchronous output address aoa has the same phase as the second latch input address lia2. That is, in a state where the clock clk is not generated, if the address strobing signal ast is enabled, the asynchronous output address aoa is generated.

The phase control unit 70 receives the synchronous output address soa or the asynchronous output address aoa, controls a phase of the received synchronous output address soa or asynchronous output address aoa, and outputs it as an output address oad. That is, the phase control unit 70 may include at least one inverter, controls the phase of the synchronous output address soa or the asynchronous output address aoa, and finally outputs the output address oad.

The buffering enable signal ben is a low level enable signal, and the command pulse signal cmp, the address strobing signal ast, and the effect address signal vad are high level enable signals. The buffering enable signal ben can be generated by using a falling edge of a /CS signal. In addition, the command pulse signal cmp can be generated by using a rising edge of the clock clk input in a state where the /ADV signal is enabled. Further, the address strobing signal ast can be generated by using the falling edge of the /ADV signal, a command signal instructing an input operation of an address, or the rising edge of the clock clk input in a state where the /ADV signal is enabled. In addition, the valid address signal vad can be generated by inverting the phase of the /ADV signal.

Meanwhile, the methods of generating the buffering enable signal ben, the command pulse signal cmp, the address strobing signal ast, and the valid address signal vad are not limited thereto.

Figure 6:
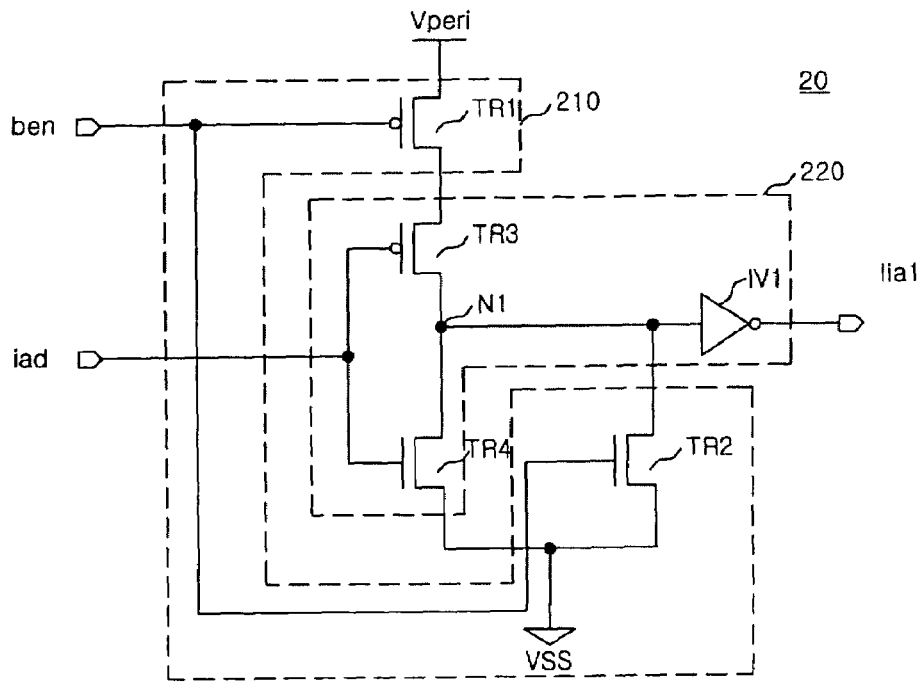
FIG. 6 is a circuit diagram illustrating the detailed structure of the address input unit shown in FIG. 5.

FIG. 6 is a circuit diagram illustrating the detailed structure of the address input unit shown in FIG. 5.

As shown in FIG. 6, the address input unit 20 includes a first control section 210 that controls the input of the input address iad according to whether the buffering enable signal ben is enabled or not; and a first driving section 220 that drives the input address iad in response to the control of the first control unit 210, and generates the first latch input address lia1.

In this case, the first control section 210 includes a first transistor TR1 whose gate terminal receives the buffering enable signal ben, whose source terminal is applied with a peripheral voltage Vperi, and whose drain terminal is coupled with the first driving section 220; and a second transistor TR2 whose gate terminal receives the buffering enable signal ben, whose drain terminal is coupled with the first driving section 220, and whose source terminal is coupled with a ground terminal.

In addition, the first driving section 220 includes a third transistor TR3 whose gate terminal receives the input address iad, whose source terminal is coupled with the drain terminal of the first transistor TR1 included in the first control section 210, and whose drain terminal is coupled with a first node N1 which is a common node with the drain terminal of the second transistor TR2 included in the first control section 210; a fourth transistor TR4 whose gate terminal receives the input address iad, whose drain terminal is coupled with the first node N1, and whose source terminal is coupled with the ground terminal; and a first inverter IV1 that inverts the phase of a voltage applied to the first node N1, and outputs the first latch input address lia1.

Since the buffering enable signal ben is a low level enable signal, if the buffering enable signal ben is disabled, the first transistor TR1 is turned off, and the second transistor TR2 is turned on. Therefore, the voltage of the first node N1 is low level, and the first latch input address lia1 is a high-level signal. At this time, the first latch input address lia1 does not function as an address.

Meanwhile, if the buffering enable signal ben is enabled, the first transistor TR1 is turned on, and the second transistor TR2 is turned off. At this time, the voltage applied to the first node N1 has the form of the inverted phase of the input address iad. Therefore, the first latch input address lia1 is obtained by making the input address iad pass through the two inverters. That is, the input address iad input when the buffering enable signal ben is enabled is driven by the two inverters and is then output as the first latch input address lia1.

Figure 7:
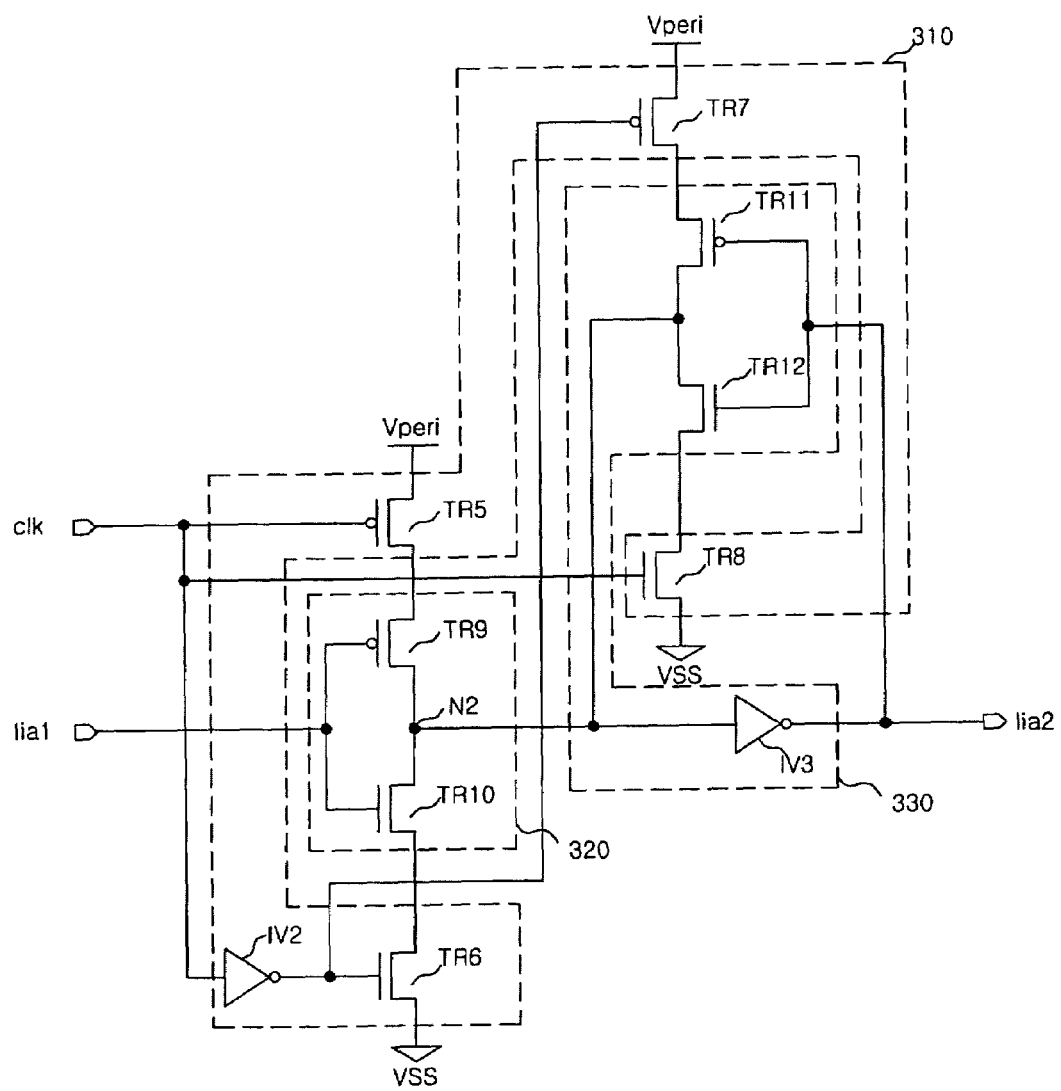
FIG. 7 is a circuit diagram illustrating the detailed structure of the clock synchronizing unit shown in FIG. 5.

FIG. 7 is a circuit diagram illustrating the detailed structure of the clock synchronizing unit shown in FIG. 5.

The clock synchronizing unit 30 includes a second control section 310 that controls a driving and latching operation on the first latch input address lia1 in response to the input of the clock clk; a second driving section 320 that drives the first latch input address lia1 according to the control of the second control section 310; and a first latch section 330 that latches the signal driven by the second driving section 320 according to the control of the second control section 310.

The second control unit 310 includes a fifth transistor TR5 whose gate terminal receives the clock clk, whose source terminal is applied with a peripheral voltage Vperi, and whose drain terminal is coupled with the second driving section 320; a second inverter IV2 that inverts the phase of the clock clk; a sixth transistor TR6 whose gate terminal receives an output signal of the second inverter IV2, whose drain terminal is coupled with the second driving section 320, and whose source terminal is coupled with a ground terminal; a seventh transistor TR7 whose gate terminal receives an output signal of the second inverter IV2, whose source terminal is applied with the peripheral voltage Vperi, and whose drain terminal is coupled with the first latch section 330; and an eighth transistor TR8 whose gate terminal receives the clock clk, whose drain terminal is coupled with the first latch section 330, and whose source terminal is coupled with a ground terminal.

In addition, the second driving section 320 includes a ninth transistor TR9 whose gate terminal receives the first latch input address lia1, whose source terminal is coupled with the drain terminal of the fifth transistor TR5 included in the second control section 310, and whose drain terminal is coupled with a second node N2; and a tenth transistor TR10 whose gate terminal receives the first latch input address lia1, whose drain terminal is coupled with the second node N2, and a source terminal is coupled with a drain terminal of the sixth transistor TR6 of the second control section 310.

Further, the first latch section 330 includes a third inverter IV3 that inverts the phase of a voltage applied to the second node N2 of the second driving section 320 and outputs it as the second latch input address lia2; an eleventh transistor TR11 whose gate terminal receives the second latch input address lia2, whose source terminal is coupled with the drain terminal of the seventh transistor TR7 included in the second control section 310, and whose drain terminal is coupled with the second node N2; and a twelfth transistor TR12 whose gate terminal receives the second latch input address lia2, whose drain terminal is coupled with the second node N2, and whose source terminal is coupled with the drain terminal of the eighth transistor TR8 included in the second control section 310.

When the voltage of the clock clk input to the clock synchronizing unit 30 is at a low level, the fifth and sixth transistors TR5 and TR6 of the second control section 310 are turned on, and the seventh and eighth transistors TR7 and TR8 are turned off. Therefore, the phase of the first latch input address lia1 is inverted by the ninth and tenth transistors TR9 and TR10 of the second driving section 320, and the inverted first latch input address lia1 is transmitted to the second node N2. The phase of the signal transmitted to the second node N2 is inverted again by the third inverter IV3, and the inverted signal is then output as the second latch input address lia2. At this time, since the seventh and eighth transistors TR7 and TR8 are turned off, a latch operation using the first latch section 330 is not performed.

Meanwhile, if the voltage of the clock clk is at a high level, the fifth and sixth transistors TR5 and TR6 of the second control section 310 are turned off, and the seventh and eighth transistors TR7 and TR8 are turned on. Therefore, a driving operation of the first latch input address lia1 through the second driving section 320 is not performed. Meanwhile, since the seventh and eighth transistors TR7 and TR8 are turned on, a latch operation of the first latch section 330 is performed. If the clock clk is at a high level, the second latch input address lia2 output when the voltage of the clock clk is at a low level is inverted by the eleventh and twelfth transistors TR11 and TR12 and then transmitted to the second node N2. Then, the signal transmitted to the second node N2 is inverted by the third inverter IV3 and is the second latch input address lia2. The above-described operation is repeatedly performed.

As such, when the voltage of the input clock clk is at a low level, the clock synchronizing unit 30 drives the first latch input address lia1 to generate the second latch input address lia2. When the voltage of the input clock clk is at a high level, the clock synchronizing unit 30 latches the generated second latch input address lia2.

Figure 8:
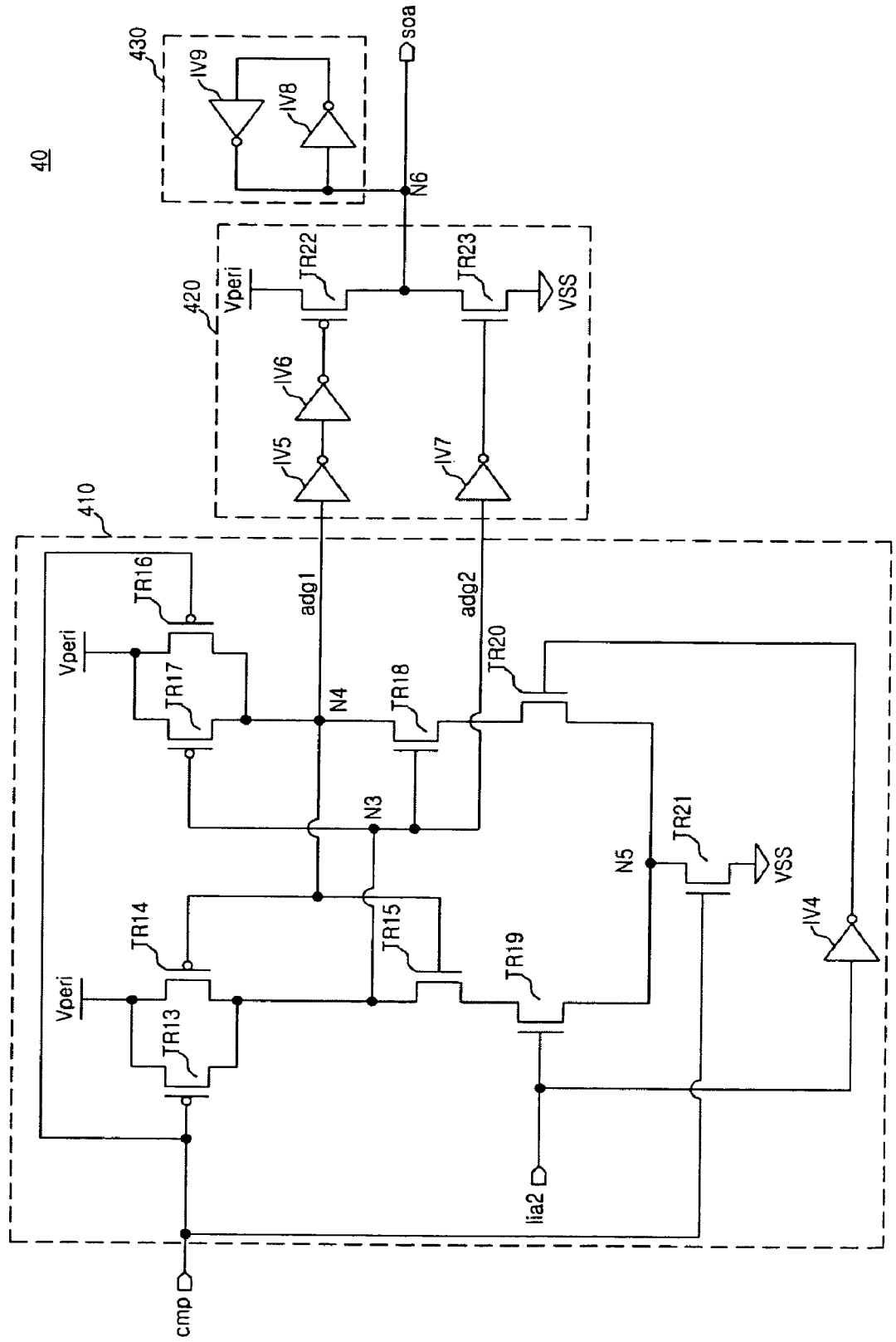
FIG. 8 is a circuit diagram illustrating the detailed structure of the synchronous address latch unit shown in FIG. 5.

FIG. 8 is a circuit diagram illustrating the detailed structure of the synchronous address latch unit shown in FIG. 5.

As shown in FIG. 8, the synchronous address latch unit 40 includes a first address generating control section 410 that generates first and second address generating signals adg1 and adg2 from the second latch input address lia2 in response to whether the command pulse signal cmp is enabled or not; a first address generating section 420 that receives the first and second address generating signals adg1 and adg2 to generate a synchronous output address soa; and a second latch unit 430 that latches the synchronous output address soa.

The first address generating section 410 includes a thirteenth transistor TR13 whose gate terminal receives the command pulse signal cmp, whose source terminal is applied with the peripheral voltage Vperi, and whose drain terminal is coupled with a third node N3; a fourteenth transistor TR14 whose gate terminal is coupled with a fourth node N4; whose source terminal is applied with the peripheral voltage Vperi, and whose drain terminal is coupled with the third node N3; a fifteenth transistor TR15 whose gate terminal is coupled with the fourth node N4, and whose drain terminal is coupled with the third node N3; a sixteenth transistor TR16 whose gate terminal receives the command pulse signal cmp, whose source terminal is applied with the peripheral voltage Vperi, and whose drain terminal is coupled with the fourth node N4; a seventeenth transistor TR17 whose gate terminal is coupled with the third node N3, whose source terminal is applied with the peripheral voltage Vperi, and whose drain terminal is coupled with the fourth node N4; an eighteenth transistor TR18 whose gate terminal is coupled with the third node N3, and whose drain terminal is coupled with the fourth node N4; a nineteenth transistor TR19 whose gate terminal receives the second latch input address lia2, whose drain terminal is coupled with the source terminal of the fifteenth transistor TR15, and whose source terminal is coupled with a fifth node N5; a fourth inverter IV4 that inverts the second latch input address lia2; a twentieth transistor TR20 whose gate terminal receives an output signal of the fourth inverter IV4, whose drain terminal is coupled with the source terminal of the eighteenth transistor TR18, and whose source terminal is coupled with the fifth node N5; and a twenty-first transistor TR21 whose gate terminal receives the command pulse signal cmp, whose drain terminal is coupled with the fifth node N5, and whose source terminal is coupled with a ground terminal.

The signal that is transmitted from the fourth node N4 to the first address generating section 420 is the first address generating signal adg1, and the signal that is transmitted from the third node N3 to the first address generating section 420 is the second address generating signal adg2.

In addition, the first address generating section 420 includes fifth and sixth inverters IV5, and IV6 that perform non-inverted driving on the first address generating signal adg1; a seventh inverter IV7 that performs inverted driving on the second address generating signal adg2; a twenty-second transistor TR22 whose gate terminal receives an output signal of the sixth inverter IV6, whose source terminal is applied with the peripheral voltage Vperi, and whose drain terminal is coupled with the sixth node N6; and a twenty-third transistor TR23 whose gate terminal receives an output signal of the seventh inverter IV7, whose drain terminal is coupled with the sixth node N6, and whose source terminal is coupled with a ground terminal.

The signal that is transmitted to the sixth node N6 is the synchronous output address soa.

The second latch section 430 includes eighth and ninth inverters IV8 and IV9 that form a latch structure for the synchronous output address soa of the sixth node N6.

In the synchronous address latch unit 40 that has the above-described structure, when the input command pulse signal cmp is enabled, the thirteenth and sixteenth transistors TR13 and TR16 of the first address generating section 410 are turned off, and the twenty-first transistor TR21 is turned on. Accordingly, the second latch input address lia2 affects the operation of the first address generating control section 410. That is, when the voltage of the second latch input address lia2 is at a high level, the nineteenth transistor TR19 is turned on, and the twentieth transistor TR20 is turned off. As a result, the voltage of the third node N3 is low level, and the voltage of the fourth node N4 is high level. Then, the first address generating signal adg1 that is at a high level turns off the twenty-second transistor TR22 of the first address generating section 420, and the second address generating signal adg2 that is at a low level turns on the twenty-third transistor TR23. Accordingly, the voltage of the synchronous output address soa that is applied to the sixth node N6 is low level, and the synchronous output address soa is stored in the second latch section 430. Similarly, when the command pulse signal cmp is enabled, if the second latch input address lia2 of low level is input, the synchronous output address soa is high level, and is then stored in the second latch section 430.

Meanwhile, if the command pulse signal cmp is disabled, since the thirteenth and sixteenth transistors TR13 and TR16 of the first address generating control section 410 are turned on, a high level voltage is applied to the third and fourth nodes N3 and N4 regardless of the second latch input address lia2. Therefore, the first address generating signal adg1 that has a high level voltage turns off the twenty-second transistor TR22 of the first address generating unit 420. In addition, the second address generating signal adg2 that has a high level voltage of the turns off the twenty-third transistor TR23. Therefore, the first and second address generating signals adg1 and adg2 are not transmitted to the sixth node N6. Meanwhile, since the synchronous output address soa is stored in advance in the second latch section 430, the sixth node N6 maintains the voltage level of the synchronous output address soa that is stored in advance.

As such, when the command pulse signal, cmp is enabled, the synchronous address latch unit 40 generates the synchronous output address soa from the second latch input address lia2, and when the command pulse signal cmp is disabled, the synchronous address latch unit 40 continuously outputs the stored synchronous output address soa. Since the command pulse signal cmp is generated by the clock clk, the synchronous address latch unit 40 buffers the address by the control of the clock.

Figure 9:
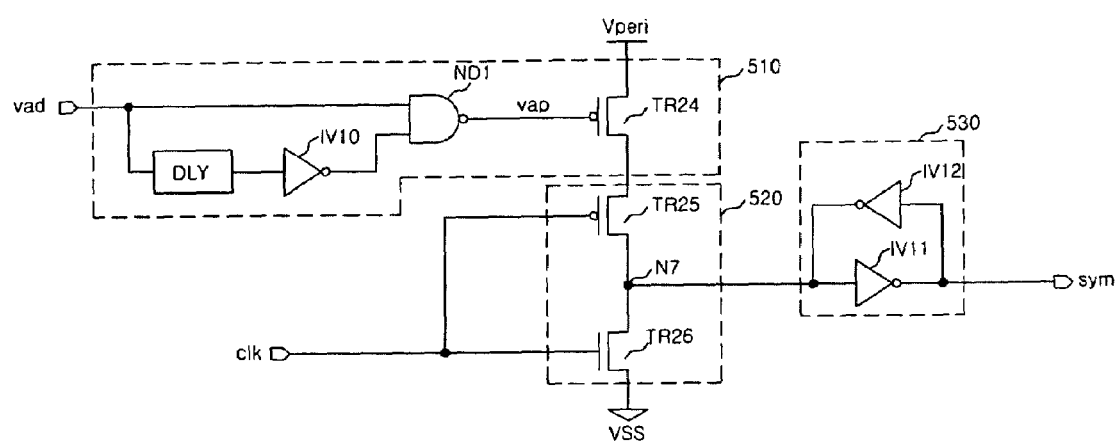
FIG. 9 is a circuit diagram illustrating the detailed structure of the synchronous mode detecting unit shown in FIG. 5.

FIG. 9 is a circuit diagram illustrating the detailed structure of the synchronous mode detecting unit shown in FIG. 5.

The synchronous mode detecting unit 50 includes a third control section 510 that controls driving and latching the clock clk in response to whether the valid address signal vad is enabled; a third driving section 520 that drives the clock clk according to control of the third control section 510; and a third latch section 530 that latches a signal driven by the third driving section 520.

The third control section 510 includes a delay unit DLY that delays the valid address signal vad for a predetermined time; a tenth inverter IV10 that inverts an output signal of the delay unit DLY; a first NAND gate ND1 that receives the valid address signal vad and the output signal of the tenth inverter IV10 and outputs a valid address pulse signal vap; and a twenty-fourth transistor TR24 whose gate terminal receives the valid address pulse signal vap, whose source terminal is applied with the peripheral voltage Vperi, and whose source terminal is coupled with the third driving section 520.

In addition, the third driving section 520 includes a twenty-fifth transistor TR25 whose gate terminal receives the clock clk, whose source terminal is coupled with the drain terminal of the twenty-fourth transistor TR24 included in the third control section 510, and whose drain terminal is coupled with a seventh node N7; and a twenty-sixth transistor TR26 whose gate terminal receives the clock clk, whose drain terminal is coupled with the seventh node N7, and whose source terminal is coupled with a ground terminal.

Further, the third latch section 530 includes eleventh and twelfth inverters IV11 and IV12 that form a latch structure for a signal transmitted to the seventh node N7.

Since the valid address signal vad is a high level enable signal, the valid address pulse signal vap that is output by the first NAND gate ND1 is a low level enable signal that has a shorter enable time than the valid address signal vad. Since the twenty-fourth transistor TR24 of the third control section 510 is turned on when the valid address pulse signal vap is enabled, the third driving section 520 inverts the clock clk and transmits the inverted clock clk to the seventh node N7. Then, the eleventh and twelfth inverters IV11 and IV12 of the third latch section 530 invert the signal transmitted to the seventh node N7 to output the synchronous mode signal sym, and store it.

Meanwhile, when the valid address pulse signal vap is disabled, the third driving section 520 cannot transmit the clock clk to the seventh node N7, since the twenty-fourth transistor TR24 of the third control section 510 is turned off. At this time, since the eleventh and twelfth inverters IV11 and IV12 of the third latch section 530 store the synchronous mode signal sym, they continuously output the synchronous mode signal sym.

As such, the synchronous mode detecting unit 50 drives and latches the clock clk according to the control of the input valid address signal vad, and generates the synchronous mode signal sym. Then, when the clock clk is not input, the apparatuses receiving the synchronous mode signal sym can recognize that the current mode is an asynchronous mode, since the synchronous mode signal sym is disabled. Further, when the clock clk is input, the devices receiving the synchronous mode signal sym can recognize that the current mode is a synchronous mode, since the synchronous mode signal sym is enabled.

Figure 10:
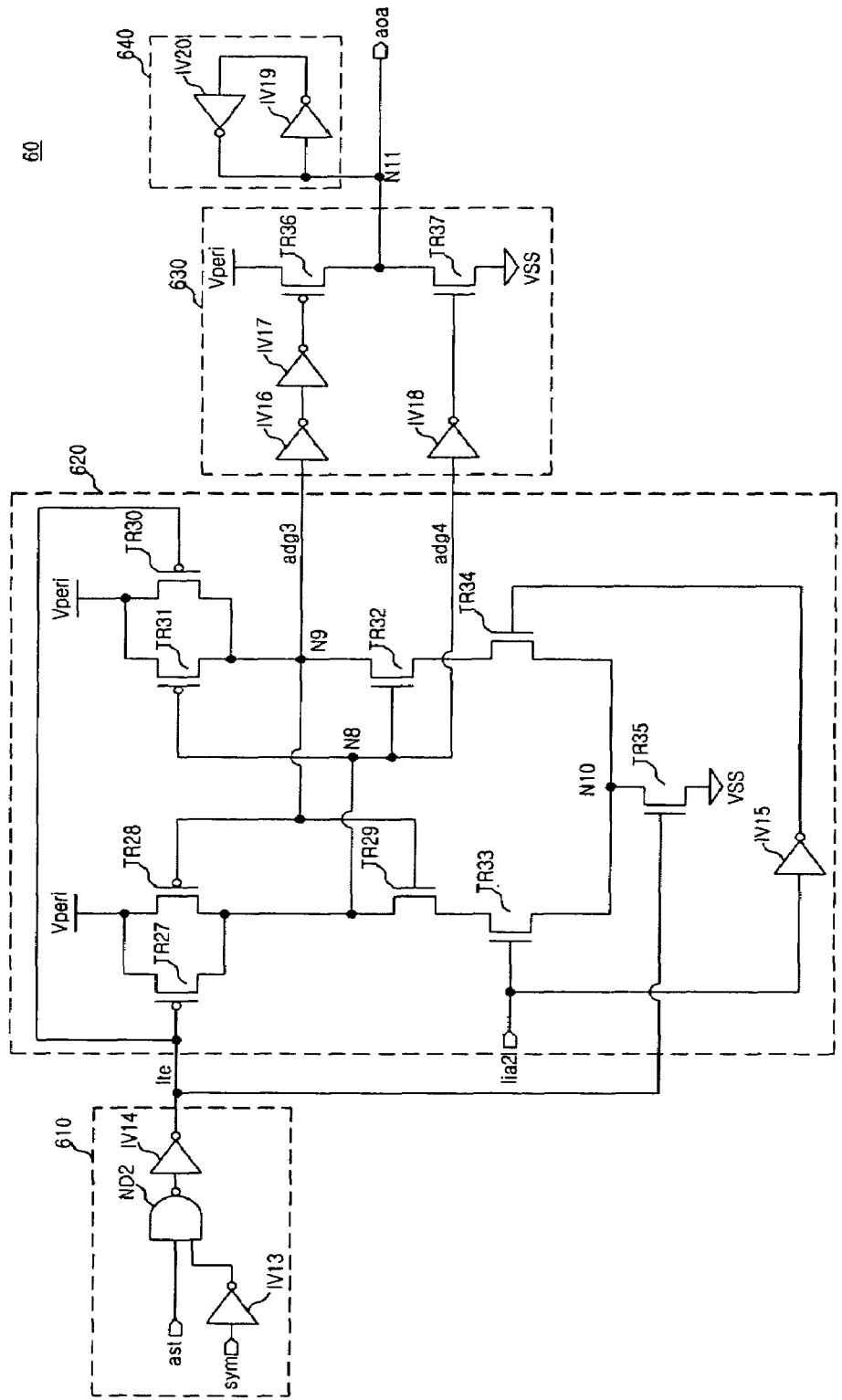
FIG. 10 is a circuit diagram illustrating the detailed structure of the asynchronous address latch unit shown in FIG. 5.

FIG. 10 is a circuit diagram illustrating the detailed structure of the asynchronous address latch unit shown in FIG. 5.

As shown in FIG. 10, the asynchronous address latch unit 60 includes a signal combining section 610 that combines the synchronous mode signal sym and the address strobing signal ast so as to generate a latch enable signal lte; a second address generating control section 620 that generates third and fourth address generating signals adg3 and adg4 from the second latch input address lia2 in response to whether the latch enable signal lte is enabled; a second address generating section 630 that receives the third and fourth address generating signals adg3 and adg4 so as to generate the asynchronous output address aoa; and a fourth latch section 640 that latches the asynchronous output address aoa.

The signal combining section 610 includes a thirteenth inverter IV13 that inverts the synchronous mode signal sym; a second, NAND gate ND2 that receives an output signal of the thirteenth inverter IV13 and the address strobing signal ast; and a fourteenth inverter IV14 that inverts an output signal of the second NAND gate ND2 to output the latch enable signal lte.

In addition, the second address generating control unit 620 includes a twenty-seventh transistor TR27; a twenty-eighth transistor TR28; a twenty-ninth transistor TR29; a thirtieth transistor TR30; a thirty-first transistor TR31; a twenty-second transistor TR32; a thirty-third transistor TR33; a fifteenth inverter IV15; a thirty-fourth transistor TR34; and a thirty-fifth transistor TR35.

The twenty-seventh transistor TR27 has a gate terminal receiving the latch enable signal lte, a source terminal applied with the peripheral voltage Vperi, and a drain terminal coupled with an eighth node N8.

The twenty-eighth transistor TR28 has a gate terminal coupled with a ninth node N9, a source terminal applied with the peripheral voltage Vperi, and a drain terminal coupled with the eighth node N8.

The twenty-ninth transistor TR29 has a gate terminal coupled with the ninth node N9, and a drain terminal coupled with the eighth node N8.

The thirtieth transistor TR30 has a gate terminal receiving the latch enable signal lte, a source terminal applied with the peripheral voltage Vperi, and a drain terminal coupled with the ninth node N9.

The thirty-first transistor TR31 has a gate terminal coupled with the eighth node N8, a source terminal applied with the peripheral voltage Vperi, and a drain terminal coupled with the ninth node N9.

The thirty-second transistor TR32 has a gate terminal coupled with the eighth node N8, and a drain terminal coupled with the ninth node N9.

The thirty-third transistor TR33 has a gate terminal receiving the second latch input address lia2, a drain terminal coupled with the source terminal of the twenty-ninth transistor TR29, and a source terminal coupled with a tenth node N10.

The fifteenth inverter IV15 inverts the second latch input address lia2.

The thirty-fourth transistor TR34 has a gate terminal receiving an output signal of the fifteenth inverter IV15, a drain terminal coupled with the source terminal of the thirty-second transistor TR32, and a source terminal coupled with the tenth node N10.

The thirty-fifth transistor TR35 has a gate terminal receiving the latch enable signal lte, a drain terminal coupled with the tenth node N10, and a source terminal coupled with a ground terminal.

A signal that is transmitted from the ninth node N9 to the second address generating section 630 is the third address generating signal adg3, and a signal that is transmitted from the eighth node N8 to the second address generating section 630 is the fourth address generating signal adg4.

In addition, the second, address generating section 630 includes sixteenth and seventeenth inverters IV16 and IV17 that perform non-inverted driving on the third address generating signal adg3; an eighteenth inverter IV18 that performs inverted driving on the fourth address generating signal adg4; a thirty-sixth transistor TR36 whose gate terminal receives an output signal of the seventeenth inverter IV17, whose source terminal is applied with the peripheral voltage Vperi, and whose drain terminal is coupled with an eleventh node N11; and a thirty-seventh transistor TR37 whose gate terminal receives an output signal of the eighteenth inverter IV18, whose drain terminal is coupled with the eleventh node N11, and whose source terminal is coupled with a ground terminal.

A signal that is transmitted to the eleventh node N11 is the asynchronous output address aoa.

The fourth latch section 640 includes nineteenth and twentieth inverters IV19 and IV20 that form a latch structure for the synchronous output address aoa of the eleventh node N11.

In the asynchronous address latch unit. 60 that has the above-described structure, when the synchronous mode signal sym input to the signal combining section 610 is enabled, an output signal of the signal combining section 610 has a low level voltage regardless of whether the address strobing signal ast is enabled or not. That is, in a synchronous mode in which the clock is input, the latch enable signal lte is disabled. Meanwhile, when the synchronous mode signal sym is disabled, the address strobing signal ast passes through the second NAND gate ND2 and the fourteenth inverter IV14 to be then output as the latch enable signal lte. That is, in an asynchronous mode in which the clock is not input, the latch enable signal lte is enabled.

When the latch enable signal lte is enabled, the twenty-seventh and thirtieth transistors TR27 and TR30 of the second address generating control section 620 are turned off, and the thirty-fifth transistor TR35 is turned on. Accordingly, the second latch input address lia2 affects the operation of the second address generating control section 620. That is, when the voltage of the second latch input address lia2 is at a high level, the thirty-third transistor TR33 is turned on, and the thirty-fourth transistor TR34 is turned off. As a result, the voltage of the eighth node N8 is low level, and the voltage of the ninth node N9 is high level. Then, the third address generating signal adg3 that is at a high level turns off the thirty-sixth transistor TR36 of the second address generating section 630, and the fourth address generating signal adg4 that is at a low level turns off the thirty-seventh transistor TR37. Accordingly, the voltage of the asynchronous output address aoa that is applied to the eleventh node N11 is low level, and the asynchronous output address aoa is stored in the fourth latch section 640. Similarly, when the latch enable signal lte is enabled, if the second latch input address lia2 of the low level is input, the voltage of the asynchronous output address aoa is high level, and the asynchronous output address aoa is stored in the fourth latch section 640.

Meanwhile, when the latch enable signal lte is disabled, since the twenty-seventh and thirtieth transistors TR27 and TR30 of the second address generating control section 620 are turned on, a high level voltage is applied to the eighth and ninth nodes N8 and N9 regardless of the second latch input address lia2. Therefore, the third address generating signal adg3 that has a high level voltage turns off the thirty-sixth transistor TR36 of the second address generating unit 630. In addition, the fourth address generating signal adg4 that has the high level voltage turns off the thirty-seventh transistor TR37. Therefore, the third and fourth address generating signals adg3 and adg4 are not transmitted to the eleventh node N11. Meanwhile, since the asynchronous output address aoa is stored in advance in the fourth latch section 640, the eleventh node N11 maintains the voltage level of the asynchronous output address aoa that is stored in advance.

As such, when the latch enable signal lte is enabled, the asynchronous address latch unit 60 generates the asynchronous output address aoa from the second latch input address lia2. When the latch enable signal lte is disabled, the asynchronous address latch unit 60 continuously outputs the stored synchronous output address soa. Since the latch enable signal lte is generated by the address strobing signal ast in an asynchronous mode, the asynchronous address latch unit 60 buffers the address, when the clock is not input.

Figure 11:
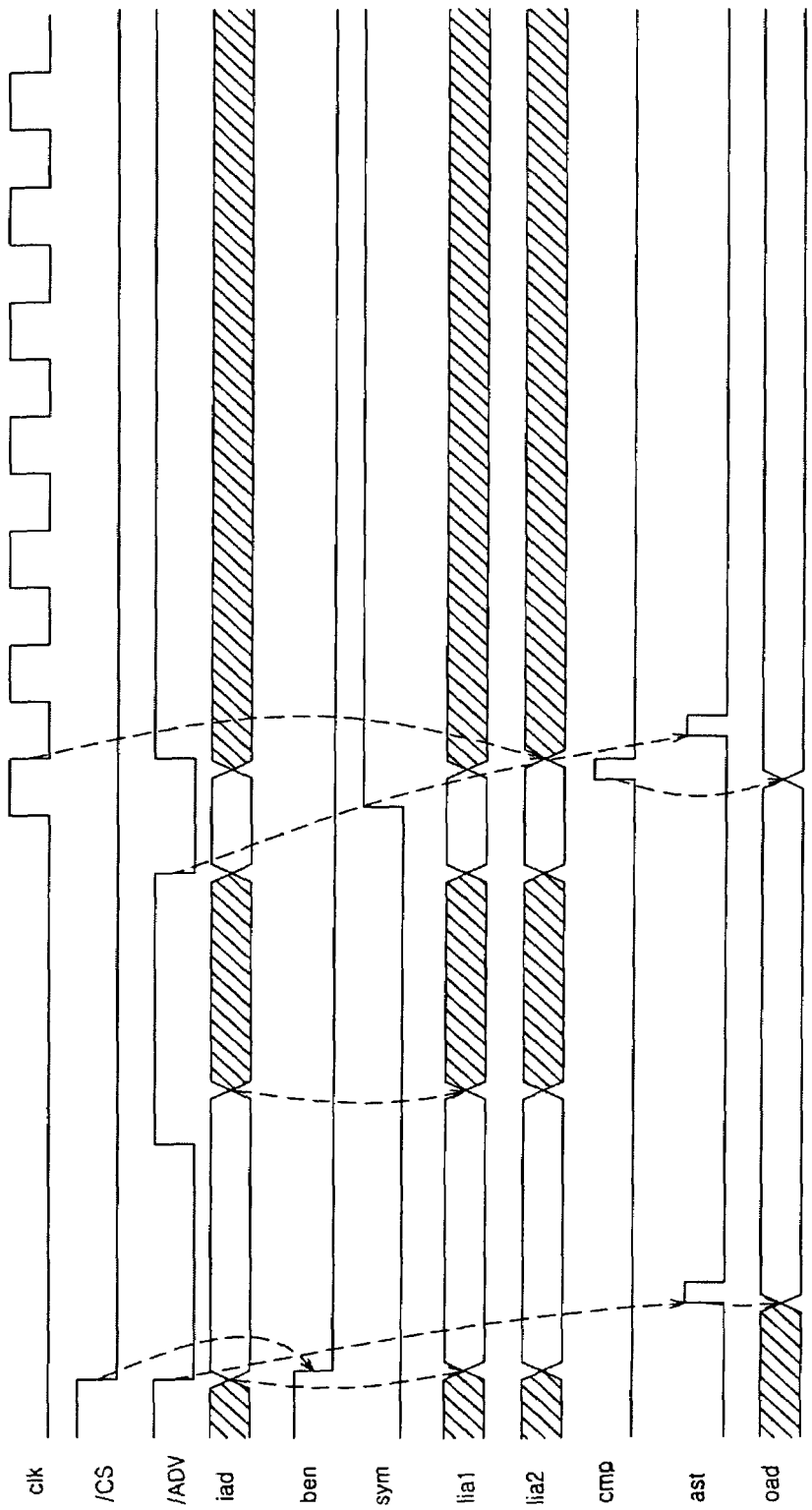
FIG. 11 is a timing chart illustrating the operation of an address buffer in a semiconductor memory apparatus according to an embodiment of the present invention.

FIG. 11 is a timing chart illustrating the operation of an address buffer in a semiconductor memory device according to an embodiment of the present invention. In order to describe the operation of the address buffer according to whether the clock is input or not, an operation interval is divided into an interval where the clock is not inputted, and an interval where the clock is input.

FIG. 11 shows the clock clk, the /CS signal, the /ADV signal, the input address iad, the buffering enable signal ben, the synchronous mode signal sym, the first latch input address lia1, the second latch input address lia2, the command pulse signal cmp, the address strobing signal ast, and the output address oad. In this case, the /CS signal, the /ADV signal, and the buffering enable signal ben are low level enable signals.

From FIG. 11, it can be understood that the buffering enable signal ben is enabled by the falling edge time of the /CS signal. Further, it can be understood that due to the /ADV signal, the input address iad has a valid value, and the address strobing signal ast is generated. At this time, the interval where the input address iad has a valid value is limited to the clock clk, as in the related art. In addition, when the clock clk starts to be input, the synchronous mode signal sym is enabled. When the buffering enable signal ben is enabled, the first latch input address lia1 has the same phase as the input address iad. Further, the second latch input address lia2 has the same phase as the first latch input address lia1. At this time, during an interval of when the clock clk is input, a valid value of the second latch input address lia2 is maintained until a falling edge time of the clock clk.

During an interval of when the clock clk is not input, that is, in an asynchronous mode, the output address oad is generated from the second latch input address lia2 at a rising edge time of the address strobing signal ast. In addition, in an internal where the clock clk is input, that is, in a synchronous mode, the output address oad is generated from the second latch input address lia2 at a rising edge time of the command pulse signal cmp. The address strobing signal ast is enabled even in a synchronous mode interval. Nevertheless, since the synchronous mode signal sym is enabled, the address strobing signal ast does not affect the generation of the output address oad. As a result, in an address buffer in a semiconductor memory apparatus according to an embodiment of the present invention, the output address oad is generated regardless of whether the clock is input or not.

As such, in the semiconductor memory apparatus according to the embodiments of the present invention, the output address is generated by selectively using the command pulse signal or the address strobing signal according to whether the clock is input or not, such that an address buffering operation can be performed in both a synchronous mode and an asynchronous mode. Therefore, in implementing a semiconductor memory apparatus, such as a Pseudo SRAM, in which the clock is selectively used, technical limits can be overcome.

It will be apparent to those skilled in the art that various modifications and changes may be made without departing from the scope and spirit of the present invention. Therefore, it should be understood that the above embodiments are not limiting, but illustrative in all aspects. The scope of the present invention is defined by the appended claims rather than by the description preceding them, and therefore all changes and modifications that fall within the metes and bounds of the claims, or equivalents of such metes and bounds are therefore intended to be embraced by the claims.

In an address buffer and a method of buffering an address for a semiconductor memory apparatus according to an embodiment of the present invention, when a clock is input, a synchronous address buffering operation is performed, and when the clock is not input, an asynchronous address buffering operation is performed. Therefore, an address buffering operation can be performed regardless of whether the clock is input or not.

What is claimed is:

1. An address buffer in a semiconductor memory apparatus comprising:
   an address input unit configured to generate a first latch input address from a buffering enable signal and an input address;
   a clock synchronizing unit configured to generate a second latch input address from the first latch input address and a clock;
   a synchronous address latch unit configured to generate a synchronous output address from a command pulse signal and the second latch input address;
   a synchronous mode detecting unit configured to determine whether a mode is a synchronous mode or not from a valid address signal and the clock to generate a synchronous mode signal; and
   an asynchronous address latch unit configured to generate an asynchronous output address from the synchronous mode signal, an address strobing signal, and the second latch input address.

2. The address buffer of claim 1,
   wherein the address input unit comprises:
   a control section configured to control input of the input address in response to whether the buffering enable signal is enabled; and
   a driving section configured to drive the input address according to the control of the control unit to generate the first latch input address.

3. The address buffer of claim 2,
   wherein the control section comprises:
   a first transistor having a gate terminal configured to receive the buffering enable signal, a source terminal configured to receive a peripheral voltage, and a drain terminal coupled with the driving section; and
   a second transistor having a gate terminal configured to receive the buffering enable signal, a drain terminal coupled with the driving section, and a source terminal coupled with a ground terminal.

4. The address buffer of claim 3,
   where the driving section comprises:
   a first node;
   a third transistor having a gate terminal configured to receive the input address, a source terminal coupled with the control section, and a drain terminal coupled with the control section through the first node;
   a fourth transistor having a gate terminal configured to receive the input address, a drain terminal coupled with the first node, and a source terminal coupled with a ground terminal; and
   an inverter configured to invert the phase of a voltage applied to the first node and output the first latch input address.

5. The address buffer of claim 4,
   wherein the drain terminal of the first transistor is coupled with the source terminal of the third transistor, and
   the drain terminal of the second transistor is coupled with the first node.

6. The address buffer of claim 1,
   wherein the clock synchronizing unit comprises:
   a control section configured to control driving and latching the first latch input address in response to the clock input;
   a driving section configured to drive the first latch input address according to the control of the control section; and
   a latch section configured to latch the first latch input driven by the driving section according to the control of the control unit.

7. The address buffer of claim 6,
   wherein the control section comprises:
   a first transistor having a gate terminal configured to receive a clock, a source terminal configured to receive a peripheral voltage, and a drain terminal coupled with the driving section;
   a first inverter configured to invert a phase of the clock and produce an output signal;
   a second transistor having a gate terminal configured to receive the output signal of the first inverter, a drain terminal coupled with the driving section, and a source terminal coupled with a ground terminal;
   a third transistor having a gate terminal configured to receive the output signal of the first inverter, a source terminal configured to receive the peripheral voltage, and a drain terminal coupled with the latch section; and
   a fourth transistor having a gate terminal configured to receive the clock, a drain terminal coupled with the latch section, and a source terminal coupled with a ground terminal.

8. The address buffer of claim 7,
   wherein the driving section comprises:
   a first node;
   a fifth transistor having a gate terminal configured to receive the first latch input address, a source terminal coupled with the control section, and a drain terminal coupled with the first node; and
   a sixth transistor having a gate terminal configured to receive the first latch input address, a drain terminal coupled with the first node, and a source terminal coupled with the control section.

9. The address buffer of claim 8,
   wherein the latch section comprises:
   a second inverter having an input terminal configured to receive the first latch input address transmitted by the driving section and output an inverted signal as the second latch input address;
   a seventh transistor having a gate terminal configured to receive the second latch input address, a source terminal coupled with the control section, and a drain terminal coupled with the input terminal of the second inverter; and
   an eighth transistor having a gate terminal configured to receive the second latch input address, a drain terminal coupled with the input terminal of the second inverter, and a source terminal coupled with the control section.

10. The address buffer of claim 9,
    wherein the drain terminal of the first transistor is coupled with the source terminal of the fifth transistor,
    the drain terminal of the second transistor is coupled with the source terminal of the sixth transistor,
    the drain terminal of the third transistor is coupled with the source terminal of the seventh transistor,
    the drain terminal of the fourth transistor is coupled with the source terminal of the eighth transistor, and
    the input terminal of the second inverter is coupled with the first node.

11. The address buffer of claim 1,
    wherein the synchronous address latch unit comprises:
    an address generating control section configured to generate first and second address generating signals from the second latch input address in response to whether the command pulse signal is enabled;

an address generating section configured to receive the first and second address generating signals and generate the synchronous output address; and a latch section configured to latch the synchronous output address.

12. The address buffer of claim 11, where the address generating control section comprises:

a first node;
a second node;
a third node;
a first transistor having a gate terminal configured to receive the command pulse signal, a source terminal is configured to receive a peripheral voltage, and a drain terminal coupled with the first node;
a second transistor having a gate terminal coupled with the second node, a source terminal configured to receive the peripheral voltage, and a drain terminal coupled with the first node;
a third transistor having a gate terminal coupled with the second node, a source terminal, and a drain terminal coupled with the first node;
a fourth transistor having a gate terminal configured to receive the command pulse signal, a source terminal configured to receive the peripheral voltage, and a drain terminal coupled with the second node;
a fifth transistor having a gate terminal coupled with the first node, a source terminal configured to receive the peripheral voltage, and a drain terminal coupled with the second node;
a sixth transistor having a gate terminal coupled with the first node, a source terminal, and a drain terminal coupled with the second node;
a seventh transistor having a gate terminal configured to receive the second latch input address, a drain terminal coupled with the source terminal of the third transistor, and a source terminal coupled with the third node;
an inverter configured to invert the second latch input address and produce an output signal;
an eighth transistor having a gate terminal configured to receive the output signal of the inverter, a drain terminal coupled with the source terminal of the sixth transistor, and a source terminal coupled with the third node; and
a ninth transistor having a gate terminal configured to receive the command pulse signal, a drain terminal coupled with the third node, and a source terminal coupled with a ground terminal, and wherein a signal output from the second node is the first address generating signal, and a signal output from the first node is the second address generating signal.

13. The address buffer of claim 11,
a first node;
wherein the address generating section comprises:
first and second inverters configured to perform non-inverted driving on the first address generating signal;
a third inverter configured to perform inverted driving on the second address generating signal, the second inverter producing an output signal;
a first transistor having a gate terminal configured to receive the output signal of the second inverter, a source terminal is configured to receive a peripheral voltage, and a drain terminal coupled with the first node; and
a second transistor having a gate terminal configured to receive the output signal of the second inverter, a drain terminal coupled with the first node, and a source terminal coupled with a ground terminal, and wherein a signal output from the first node is the synchronous output address.

14. The address buffer of claim 11,
wherein the latch section comprises:
first and second inverters forming a latch structure for the synchronous output address output by the address generating section.

15. The address buffer of claim 1,
wherein the synchronous mode detecting unit comprises:
a control section configured to perform driving and latching of the clock in response to whether the valid address signal is enabled or not;
a driving section configured to drive the clock according to the control of the control unit; and
a latch section configured to latch the clock driven by the driving section.

16. The address buffer of claim 15,
wherein the control section comprises:
a delay unit configured to delay the valid address signal for a predetermined time and produce an output signal;
a first inverter configured to invert the output signal of the delay unit and produce an output signal;
a NAND gate configured to receive the valid address signal and the output signal of the first inverter, and output a valid address pulse signal; and
a first transistor having a gate terminal configured to receive the valid address pulse signal, a source terminal configured to receive a peripheral voltage, and a drain terminal coupled with the driving section.

17. The address buffer of claim 16,
a first node;
wherein the driving section comprises:
a second transistor having a gate terminal configured to receive the clock, a source terminal coupled with the control section, and a drain terminal coupled with the first node; and
a third transistor having a gate terminal configured to receive the clock, a drain terminal coupled to the first node, and a source terminal coupled with a ground terminal.

18. The address buffer of claim 17,
wherein the latch section comprises:
a second inverter having an input terminal configured to receive a signal transmitted to the first node; and
a third inverter configured to form a latch structure together with the second inverter; and wherein
the latch section outputs the synchronous mode signal.

19. The address buffer of claim 18,
wherein the drain terminal of the first transistor is coupled with the source terminal of the second transistor, and wherein
the first node is coupled with the input terminal of the second inverter.

20. The address buffer of claim 1,
wherein the asynchronous address latch unit comprises:
a signal combining section configured to combine the synchronous mode signal and the address strobing signal so as to generate a latch enable signal;
an address generating control section configured to generate first and second address generating signals from the second latch input address in response to whether the latch enable signal is enabled or not;
an address generating section configured to receive the first and second address generating signals to generate the asynchronous output address; and
a latch section configured to latch the asynchronous output address.

21. The address buffer of claim 20,
wherein the signal combining section comprises:
a first inverter configured to invert the synchronous mode signal and produce an output signal;
a NAND gate configured to receive the output signal of the inverter and the address strobing signal and produce an output signal; and
a second inverter configured to invert the output signal of the NAND gate and output the latch enable signal.

22. The address buffer of claim 20,
wherein the address generating control section comprises:
a first node;
a second node;
a third node;
a first transistor having a gate terminal configured to receive the command pulse signal, a source terminal configured to receive a peripheral voltage, and a drain terminal coupled with the first node;
a second transistor having a gate terminal coupled with the second node, a source terminal configured to receive the peripheral voltage, and a drain terminal coupled with the first node;
a third transistor having a gate terminal coupled with the second node, a source terminal, and a drain terminal coupled with the first node;
a fourth transistor having a gate terminal configured to receive the command pulse signal, a source terminal configured to receive the peripheral voltage, and a drain terminal coupled with the second node;
a fifth transistor having a gate terminal coupled with the first node, a source terminal configured to receive the peripheral voltage, and a drain terminal coupled with the second node;
a sixth transistor having a gate terminal coupled with the first node, a source terminal, and a drain terminal coupled with the second node;
a seventh transistor having a gate terminal configured to receive the second latch input address, a drain terminal coupled with the source terminal of the third transistor, and a source terminal coupled with the third node;
an inverter configured to invert the second latch input address and produce an output signal;
an eighth transistor having a gate terminal configured to receive the output signal of the inverter, a drain terminal coupled with the source terminal of the sixth transistor, and a source terminal coupled with the third node; and
a ninth transistor having a gate terminal configured to receive the command pulse signal, a drain terminal coupled with the third node, and a source terminal coupled with a ground terminal, and wherein
a signal output from the second node is the first address generating signal, and a signal output from the first node is the second address generating signal.

23. The address buffer of claim 20,
wherein the address generating section comprises:
a first node;
first and second inverters configured to perform non-inverted driving on the first address generating signal, the second inverter is producing an output signal;
a third inverter configured to perform inverted driving on the second address generating signal;
a first transistor having a gate terminal configured to receive the output signal of the second inverter, a source terminal configured to receive a peripheral voltage, and a drain terminal coupled with the first node; and
a second transistor having a gate terminal configured to receive the output signal of the second inverter, a drain terminal coupled with the first node, and a source terminal coupled with a ground terminal, and wherein
a signal output from the first node is the synchronous output address.

24. The address buffer of claim 20,
wherein the latch section comprises:
first and second inverters configured to form a latch structure for the synchronous output address output by the address generating unit.

25. The address buffer of claim 1,
wherein the buffering enable signal comprises a row enable signal that is generated from a falling edge of a chip select signal.

26. The address buffer of claim 1,
wherein the valid address signal comprises a high enable signal that is generated by inverting a phase of a valid address command.

27. The address buffer of claim 1,
wherein the command pulse signal comprises a high enable signal that is generated from a rising edge of the clock input in a state where a valid address command becomes enabled.

28. The address buffer of claim 1,
wherein the address strobing signal comprises a high enable signal that is generated from a falling edge of a valid address command.

29. The address buffer of claim 1, further comprising:
a phase control unit configured to control a phase of the synchronous output address or the asynchronous output address, and to output the synchronous output address or the asynchronous output address as an output address.

30. The address buffer of claim 29,
wherein the phase control unit includes at least one inverter.

31. An address buffer in a semiconductor memory apparatus comprising:
a clock synchronizing unit configured to drive, when the voltage of a clock is at a low level, a first latch input address to generate a second latch input address, and configured to latch, when the voltage of the clock is at a high level, the second latch input address;
a synchronous address latch unit configured to perform, when a synchronous mode is detected, driving and latching the second latch input address to generate a synchronous output address;
an asynchronous address latch unit configured to perform, when an asynchronous mode is detected, driving and latching the second latch input address according to the control of an address strobing signal to generate an asynchronous output address; and
a phase control unit configured to control a phase of the synchronous output address or the asynchronous output address and output the synchronous output address or the asynchronous output address as an output address.

32. The address buffer of claim 31,
wherein the clock synchronizing unit comprises:
a control section configured to controls driving and latching the first latch input address in response to the clock input;
a driving section configured to drive the first latch input address according to the control of the control section; and
a latch section configured to latch a signal driven by the driving section according to the control of the control section.

33. The address buffer of claim 32,
wherein the control section comprises:
a first transistor having a gate terminal configured to receive the clock, a source terminal configured to receive a peripheral voltage, and a drain terminal coupled with the driving section;
a first inverter configured to invert a phase of the clock and produce an output signal;
a second transistor having a gate terminal configured to receive the output signal of the first inverter, a drain terminal coupled with the driving section, and a source terminal coupled with a ground terminal;
a third transistor having a gate terminal configured to receive the output signal of the first inverter, a source terminal configured to receive the peripheral voltage, and a drain terminal coupled with the latch section; and
a fourth transistor having a gate terminal configured to receive the clock, a drain terminal coupled with the latch section, and a source terminal coupled with a ground terminal.

34. The address buffer of claim 33,
wherein the driving section comprises:
a first node;
a fifth transistor having a gate terminal configured to receive the first latch input address, a source terminal coupled with the control section, and a drain terminal coupled with the first node; and
a sixth transistor having a gate terminal configured to receive the first latch input address, a drain terminal coupled with the first node, and a source terminal coupled with the control section.

35. The address buffer of claim 34,
wherein the latch section comprises:
a second inverter having an input terminal configured to receive the first latch input address transmitted by the driving section and output an inverted signal as the second latch input address;
a seventh transistor having a gate terminal configured to receive the second latch input address, a source terminal coupled with the control section, and a drain terminal coupled with the input terminal of the second inverter; and
an eighth transistor having a gate terminal configured to receive the second latch input address, a drain terminal coupled with the input terminal of the second inverter, and a source terminal coupled with the control section.

36. The address buffer of claim 35,
wherein the drain terminal of the first transistor is coupled with the source terminal of the fifth transistor,
the drain terminal of the second transistor is coupled with the source terminal of the sixth transistor,
the drain terminal of the third transistor is coupled with the source terminal of the seventh transistor,
the drain terminal of the fourth transistor is coupled with the source terminal of the eighth transistor, and
the input terminal of the second inverter is coupled with the first node.

37. The address buffer of claim 31,
wherein the synchronous address latch unit comprises:
an address generating control section configured to generate first and second address generating signals from the second latch input address, if a synchronous mode is detected;
an address generating section configured to receive the first and second address generating signals and generate the synchronous output address; and
a latch section configured to latch the synchronous output address.

38. The address buffer of claim 37,
where the address generating control section comprises:
a first node;
a second node;
a third node;
a first transistor having a gate terminal configured to receive a command pulse signal, a source terminal configured to receive a peripheral voltage, and a drain terminal coupled with the first node;
a second transistor having a gate terminal coupled with the second node, a source terminal configured to receive the peripheral voltage, and a drain terminal coupled with the first node;
a third transistor having a gate terminal coupled with the second node, a source terminal and a drain terminal coupled with the first node;
a fourth transistor having a gate terminal configured to receive the command pulse signal, a source terminal configured to receive the peripheral voltage, and a drain terminal coupled with the second node;
a fifth transistor having a gate terminal coupled with the first node, a source terminal configured to receive the peripheral voltage, and a drain terminal coupled with the second node;
a sixth transistor having a gate terminal coupled with the first node, a source terminal and a drain terminal coupled with the second node;
a seventh transistor having a gate terminal configured to receive the second latch input address, a drain terminal coupled with the source terminal of the third transistor, and a source terminal coupled with the third node;
an inverter configured to invert the second latch input address and to produce an output signal;
an eighth transistor having a gate terminal configured to receive the output signal of the inverter, a drain terminal coupled with the source terminal of the sixth transistor, and a source terminal coupled with the third node; and
a ninth transistor having a gate terminal configured to receive the command pulse signal, a drain terminal coupled with the third node, and a source terminal coupled with a ground terminal, and wherein
a signal output from the second node is the first address generating signal, and a signal output from the first node is the second address generating signal.

39. The address buffer of claim 37,
wherein the address generating section comprises:
a first node:
first and second inverters configured to perform non-inverted driving on the first address generating signal, the second inverter configured to produce an output signal;
a third inverter configured to perform inverted driving on the second address generating signal;
a first transistor having a gate terminal configured to receive the output signal of the second inverter, a source terminal configured to receive a peripheral voltage, and a drain terminal coupled with the first node; and
a second transistor having a gate terminal configured to receive the output signal of the second inverter, a drain terminal coupled with the first node, and a source terminal coupled with a ground terminal, and wherein
a signal output from the first node is the synchronous output address.

40. The address buffer of claim 37,
wherein the latch section comprises:
first and second inverters configured to form a latch structure for the synchronous output address output by the address generating section.

41. The address buffer of claim 31,
wherein the asynchronous address latch unit comprises:
a signal combining section configured to combine the synchronous mode signal and the address strobing signal so as to generate a latch enable signal;
an address generating control section configured to generate first and second address generating signals from the second latch input address in response to whether the latch enable signal is enabled or not;
an address generating section configured to receive the first and second address generating signals, and generate the asynchronous output address; and
a latch section configured to latch the asynchronous output address.

42. The address buffer of claim 41,
wherein the signal combining section comprises:
a first inverter configured to invert the synchronous mode signal and produce an output signal;
a NAND gate configured to receive the output signal of the inverter and the address strobing signal and produce an output signal; and
a second inverter configured to invert the output signal of the NAND gate and output the latch enable signal.

43. The address buffer of claim 41,
wherein the address generating control section comprises:
a first node;
a second node;
a third node;
a first transistor having a gate terminal configured to receive the command pulse signal, a source terminal configured to receive a peripheral voltage, and a drain terminal coupled with the first node;
a second transistor having a gate terminal coupled with the second node, a source terminal configured to receive the peripheral voltage, and a drain terminal coupled with the first node;
a third transistor having a gate terminal coupled with the second node, and a drain terminal coupled with the first node;
a fourth transistor having a gate terminal configured to receive the command pulse signal, a source terminal configured to receive the peripheral voltage, and a drain terminal coupled with the second node;
a fifth transistor having a gate terminal coupled with the first node, a source terminal configured to receive the peripheral voltage, and a drain terminal coupled with the second node;
a sixth transistor having a gate terminal coupled with the first node, a source terminal and a drain terminal coupled with the second node;
a seventh transistor having a gate terminal configured to receive the second latch input address, a drain terminal coupled with the source terminal of the third transistor, and a source terminal coupled with the third node;
an inverter configured to invert the second latch input address and produce an output signal;
an eighth transistor having a gate terminal configured to receive the output signal of the inverter, a drain terminal coupled with the source terminal of the sixth transistor, and a source terminal coupled with the third node; and
a ninth transistor having a gate terminal configured to receive the command pulse signal, a drain terminal coupled with the third node, and a source terminal coupled with a ground terminal, and wherein
a signal output from the second node is the first address generating signal, and a signal output from the first node is the second address generating signal.

44. The address buffer of claim 41,
wherein the address generating section comprises:
a first node;
first and second inverters configured to perform non-inverted driving on the first address generating signal, the second inverter producing an output signal;
a third inverter configured to perform inverted driving on the second address generating signal;
a first transistor having a gate terminal configured to receive the output signal of the second inverter, a source terminal configured to receive a peripheral voltage, and a drain terminal coupled with the first node; and
a second transistor having a gate terminal configured to receive the output signal of the second inverter, a drain terminal coupled with the first node, and a source terminal coupled with a ground terminal, and wherein
a signal output from the first node is the synchronous output address.

45. The address buffer of claim 41,
wherein the latch section comprises:
first and second inverters configured to form a latch structure for the synchronous output address output by the address generating section.

46. The address buffer of claim 38,
wherein the command pulse signal comprises a high enable signal configured to be generated from a rising edge of the clock input in a state where a valid address command is enabled.

47. The address buffer of claim 31,
wherein the address strobing signal comprises a high enable signal configured to be generated form a falling edge of a valid address command.

48. The address buffer of claim 31,
wherein the phase control unit includes at least one inverter.

49. A method for buffering an address in a semiconductor memory apparatus comprising:
generating a first latch input address from a buffering enable signal and an input address;
generating a second latch input address from the first latch input address and a clock;
determining whether a mode is a synchronous mode from a valid address signal and the clock and if so generating a synchronous mode signal;
generating a synchronous output address from a command pulse signal and the second latch input address; and
generating an asynchronous output address from the synchronous mode signal, an address strobing signal, and the second latch input address.

50. The method of claim 49,
wherein the generating of the first latch input address from the buffering enable signal and the input address comprises driving, when the buffering enable signal is enabled, the input address to output the input address as the first latch input address.

51. The method of claim 49,
wherein the generating of the second latch input address from the first latch input address and the clock comprises driving, when the voltage of the clock is at a low level, the first latch input address to output the first latch input address as the second latch input address, and latching, when the voltage of the clock is at a high level, the second latch input address to continuously output the second latch input address.

52. The method of claim 49,
wherein the determining whether a mode is a synchronous mode from the valid address signal and the clock so as to generate the synchronous mode signal comprises generating a valid address pulse signal from the valid address signal, driving and latching, when the valid address pulse signal is enabled, the clock to generate the synchronous mode signal, and maintaining, when the valid address pulse signal becomes disabled, a latch state of the synchronous mode signal.

53. The method of claim 49,
wherein the generating of the synchronous output address from the command pulse signal and the second latch input address comprises driving, when the command pulse signal is enabled, the second latch input address to generate and latch the asynchronous output address, and maintaining, when the command pulse signal becomes disabled, a latch state of the generated asynchronous output address.

54. The method of claim 49,
wherein the generating of the asynchronous output address from the synchronous mode signal, the address strobing signal, and the second latch input address comprises generating a latch enable signal from the synchronous mode signal and the address strobing signal, driving, when the latch enable signal is enabled, the second latch input address to generate and latch the asynchronous output address, and maintaining, when the latch enable signal becomes disabled, a latch state of the generated asynchronous output address.

55. The method of claim 49,
wherein the buffering enable signal comprises a low enable signal generated from a falling edge of a chip select signal.

56. The method of claim 49,
wherein the valid address signal comprises a high enable signal generated by inverting a phase of a valid address command.

57. The method of claim 49,
wherein the command pulse signal comprises a high enable signal generated from a rising edge of the clock input in a state where a valid address command becomes enabled.

58. The method of claim 49,
wherein the address strobing signal comprises a high enable signal generated from a falling edge of a valid address command.

59. The method of claim 49, further comprising:
controlling the phase of the synchronous output address or the asynchronous output address to output the synchronous output address or the asynchronous output address as an output address.

60. A method for buffering an address in a semiconductor memory apparatus comprising:
driving a first latch input address to generate a second latch input address when a voltage of a clock is at a low level, and latching the second latch input address when a voltage of a clock is at a high level;
driving and latching the second latch input address to generate a synchronous output address when a synchronous mode is detected;
driving and latching the second latch input address to generate an asynchronous output address by controlling an address strobing signal when an asynchronous mode is detected; and
controlling the phase of the synchronous output address or the asynchronous output address so as to output the synchronous output address or the asynchronous output address as an output address.

61. The method of claim 60,
wherein driving and latching the second latch input address to generate the synchronous output address, comprises driving, when a command pulse signal generated at the time of a synchronous mode is enabled, the second latch input address to generate and latch the synchronous output address, and maintaining, when the command pulse signal is disabled, a latch state of the generated synchronous output address.

62. The method of claim 60,
wherein the driving and latching the second latch input address according to the control of the address strobing signal to generate the asynchronous output address comprises generating a latch enable signal from the address strobing signal inputted at the time of an asynchronous mode, driving, when the latch enable signal is enabled, the second latch input address so as to generate and latch the asynchronous output address, and maintaining, when the latch enable signal is disabled, a latch state of the generated asynchronous output address.

63. The method of claim 60,
wherein the command pulse signal comprises a high enable signal generated from a rising edge of the clock input in a state where the valid address command is enabled.

64. The method of claim 60,
wherein the address strobing signal comprises a high enable signal generated from a falling edge of a valid address command.

* * * * *